United States Patent [19]

Manley et al.

[11] Patent Number: 5,882,492
[45] Date of Patent: Mar. 16, 1999

[54] A.C. PLASMA PROCESSING SYSTEM

[75] Inventors: Barry W. Manley, Boulder, Colo.;
Keith H. Billings, Guelph, Calif.

[73] Assignee: Sierra Applied Sciences, Inc., Boulder, Colo.

[21] Appl. No.: 667,387

[22] Filed: Jun. 21, 1996

[51] Int. Cl.⁶ .................................................. C23C 14/34
[52] U.S. Cl. .............................. 204/298.08; 204/298.03; 204/298.32; 204/298.34; 156/345; 118/723 E; 118/624
[58] Field of Search .......................... 204/298.03, 298.08, 204/298.32, 298.34; 156/345 P; 118/723 E, 624

[56] References Cited

U.S. PATENT DOCUMENTS

| | | | |
|---|---|---|---|
| 4,103,324 | 7/1978 | Vandervelen et al. | 363/89 |
| 4,931,169 | 6/1990 | Scherer et al. | 204/298.11 |
| 4,936,960 | 6/1990 | Siefkes et al. | 204/192.38 |
| 4,963,238 | 10/1990 | Siefkes et al. | 204/192.12 |
| 4,981,566 | 1/1991 | Wuczinger | 204/192.13 |
| 5,006,213 | 4/1991 | Sichmann et al. | 204/192.14 |
| 5,009,764 | 4/1991 | Siefkes et al. | 204/298.08 |
| 5,074,984 | 12/1991 | Sichmann et al. | 204/192.14 |
| 5,108,571 | 4/1992 | Ludwig et al. | 204/192.13 |
| 5,126,033 | 6/1992 | Szczyrbowski et al. | 204/298.08 |
| 5,147,493 | 9/1992 | Nishimura et al. | 156/345 |
| 5,192,894 | 3/1993 | Teschner | 315/111.21 |
| 5,394,061 | 2/1995 | Fujii | 315/111.21 |
| 5,399,252 | 3/1995 | Scherer et al. | 204/298.18 |
| 5,422,545 | 6/1995 | Felper et al. | 315/209 R |
| 5,427,669 | 6/1995 | Drummond | 204/298.08 |
| 5,682,067 | 10/1997 | Manley et al. | 307/127 |

FOREIGN PATENT DOCUMENTS

| | | | |
|---|---|---|---|
| 0553410 | 8/1993 | European Pat. Off. | C23C 14/35 |
| 229160 | 10/1985 | German Dem. Rep. | C23C 14/38 |
| 221202 | 4/1985 | Germany | C23C 15/00 |
| 3919147 | 12/1990 | Germany | C23C 14/35 |
| 4113704 | 10/1992 | Germany | H05H 1/46 |
| 57-69324 A | 4/1982 | Japan | C23C 15/00 |
| 61-30665 A | 2/1986 | Japan | C23C 14/37 |
| 63-190168 | 8/1988 | Japan | C23C 14/34 |
| 3-56671 A | 3/1991 | Japan | C23C 14/40 |
| 3-61368 | 3/1991 | Japan | C23C 14/54 |
| 2045553 | 3/1980 | United Kingdom | H02J 1/00 |

OTHER PUBLICATIONS

Beisswenger, T. et al., "Economical Considerations on Modern Web Sputtering Technology", Society of Vacuum Coaters, 35th Annual Technical Coinferece Proceedings, pp. 128–134 (1992).

Anderson, L., "A New Technique for Arc Control in DC Sputtering", Society of Vacuum Coaters 35th Annual technical Conference Proceedings, pp. 325–329 (1992).

Schatz, Doug, "The MDX as a Strategic Tool in reducing Arcing", Application Notes, Advanced Energy Industries, Inc. (1985).

*Primary Examiner*—Nam Nguyen
*Assistant Examiner*—Steven H. VerSteeg
*Attorney, Agent, or Firm*—Klaas, Law, O'Meara & Malkin, P.C.; Bruce E. Dahl, Esq.

[57] ABSTRACT

An AC plasma processing system according to the present invention may include a transformer for placing an alternating current on a first electrode and a second electrode contained within a process chamber. The secondary winding of the transformer is connected across the first and second electrodes. The primary winding of the transformer is connected to an external power supply. A switching device connected to the primary winding of the transformer periodically short circuits the primary winding to induce a secondary voltage in the secondary winding that is less than the arcing voltage associated with the process chamber.

20 Claims, 3 Drawing Sheets

A.C. PLASMA PROCESSING SYSTEM

FIELD OF INVENTION

This invention relates to plasma processing systems in general and more specifically to power supplies for A.C. plasma processing systems.

BACKGROUND

Plasma deposition is the name given to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Such plasma deposition processes may also be used in reverse, i.e., to remove material from the surfaces of objects, in which case they are usually referred to as plasma etching or plasma cleaning processes.

Regardless of whether the plasma process is used for deposition or etching, the plasma is usually created by subjecting a low-pressure process gas (e.g., argon) contained within a vacuum chamber to an electric field created between two electrodes. The electric field ionizes the process gas, creating the plasma. In the case of a sputter deposition plasma process, the target is usually connected as the negative electrode (i.e., the cathode). The ionized process gas atoms comprising the plasma are positively charged and are accelerated toward the negatively charged target/cathode. When the ions impact the surface of the target material they dislodge atoms of the target material, releasing them into the vacuum chamber. The substrate is usually positioned with respect to the target so that a majority of the dislodged (i.e., sputtered) atoms from the target material deposit themselves onto the surface of the substrate.

In the case where the target comprises an electrically conductive material, it is generally preferable to generate the plasma by using a direct current (i.e., DC). In this case, the target material is connected as the cathode whereas the other electrode (usually the vacuum chamber itself) is connected as the anode. Unfortunately, however, direct current (DC) generally cannot be used to generate a plasma if the sputtering target, substrate, or deposited film comprises a non-conductive material. Such non-conductive materials tend to acquire a repellant charge which eventually increases to the point where it inhibits the glow discharge and prevents sputtering action.

The charge accumulation problem associated with the use of non-conductive materials can be overcome by using an alternating current (i.e., AC) power source to generate the plasma. When an AC power source is used, current flows through the plasma until the insulating material (e.g., the target) accumulates a charge sufficient to terminate the glow discharge. Then, on the next half cycle, the accumulated charge is removed and current flows in the opposite direction until the insulating material again acquires a repellant charge, this time in the opposite sense. If the AC frequency is increased to the point where the period is much shorter than the time it takes the insulating material to acquire the repellent charge, then current will flow in the plasma during the entire AC cycle. Generally speaking, a frequency in the range of 50 kHz to 100 kHz is sufficient to achieve this condition.

While many different types of AC plasma processes are known and have been used for years, they continue to be plagued by the periodic occurrence of electrical discharges or arcs within the vacuum chamber. Such electrical discharges or arcs can take on different forms depending on the characteristics of the sputtering apparatus and on the particular plasma process being used. For example, arcs may occur between the target material and the substrate itself, certainly causing a defect in the coating, if not ruining the substrate entirely. Alternatively, the arc may occur between the target and some other part of the vacuum chamber, in which case the deleterious effects of the arc are usually less severe, but nevertheless tend to degrade the overall quality of the coating. The arcs can be short lived, lasting only a few milliseconds or so, or may be continuous, again depending on the particular apparatus and process being used.

Several methods for reducing the occurrence of such arc discharges rely on the selective control of the AC power supply used to place the charge on the electrodes. For example, one such method has been to simply turn-off the AC power supply as soon as an arc is detected, then turn it back on again once the arc has dissipated. While this method can effectively quench sustained arcs, the stored energy in most power supplies takes many cycles to dissipate, increasing the response time, i.e., the time it takes to completely remove the electrical potential from the electrodes, to the point where such devices cannot effectively quench short duration arc events. Consequently, all that is really accomplished is a reduction in overall deposition rate, with little or no reduction in the adverse effects produced by the arc event itself.

Another control method has been to momentarily interrupt (e.g., disconnect) the AC power supply from the electrodes during the arc event. While the response time of this method is usually considerably faster, i.e., the voltage can be removed from the electrodes within a few milliseconds or so, it is difficult to dissipate the stored energy in the power supply. Consequently, such methods tend to stress the power supply or switching devices used to disconnect the power supply to the point of burn-out.

While other devices exist and are being used with some degree of success, none has proven to be a panacea. For example, many such other devices can only effectively suppress certain types of arc events or only arcs created under certain conditions. Other devices may have more effective arc suppression characteristics, but are usually plagued with complex electronic circuits and devices, which may be expensive to produce and/or prone to failure.

Consequently, a need exists for a method and apparatus for preventing and/or suppressing arc events in AC plasma processes and under various operating conditions. Such a method and apparatus should allow for the effective suppression of arcs under a wide range of conditions, but without the need to resort to expensive or complex circuit elements.

SUMMARY OF THE INVENTION

An AC plasma processing system according to the present invention may include a transformer for placing an alternating current on a first electrode and a second electrode contained within a process chamber. The secondary winding of the transformer is connected across the first and second electrodes. The primary winding of the transformer is connected to an external power supply. A switching device connected to the primary winding of the transformer periodically short-circuits the primary winding to induce a secondary voltage in the secondary winding that is less than the arcing voltage associated with the process chamber.

In another embodiment of the invention, the primary winding of the transformer includes a first end lead, a center tap lead, and a second end lead. The center tap lead is connected to a first terminal of an external power supply, whereas the first and second end leads are connected to the second terminal of the external power supply through respective first and second switching devices. Both the first and second switching devices are switchable from a conductive state to a non-conductive state to electrically connect and disconnect the first and second end leads of the primary winding to the second terminal of the external power supply. A switching device control system actuates the first and second switching devices in an alternating manner to create an alternating current in the secondary winding of the transformer.

Also disclosed is a method of producing a plasma that includes the steps of providing a vacuum chamber having a first electrode and a second electrode. The vacuum chamber is also adapted to receive and maintain a process gas within a predetermined pressure range. An alternating voltage having a dwell period between each positive and negative cycle is developed by the current flowing between the first and second electrodes to create the plasma. The current and hence the voltage potential between the first and second electrodes is substantially zero during the dwell period.

BRIEF DESCRIPTION OF THE DRAWINGS

Illustrative and presently preferred embodiments of the invention are shown in the accompanying drawings in which.

DETAILED DESCRIPTION OF THE INVENTION

Figure 1:
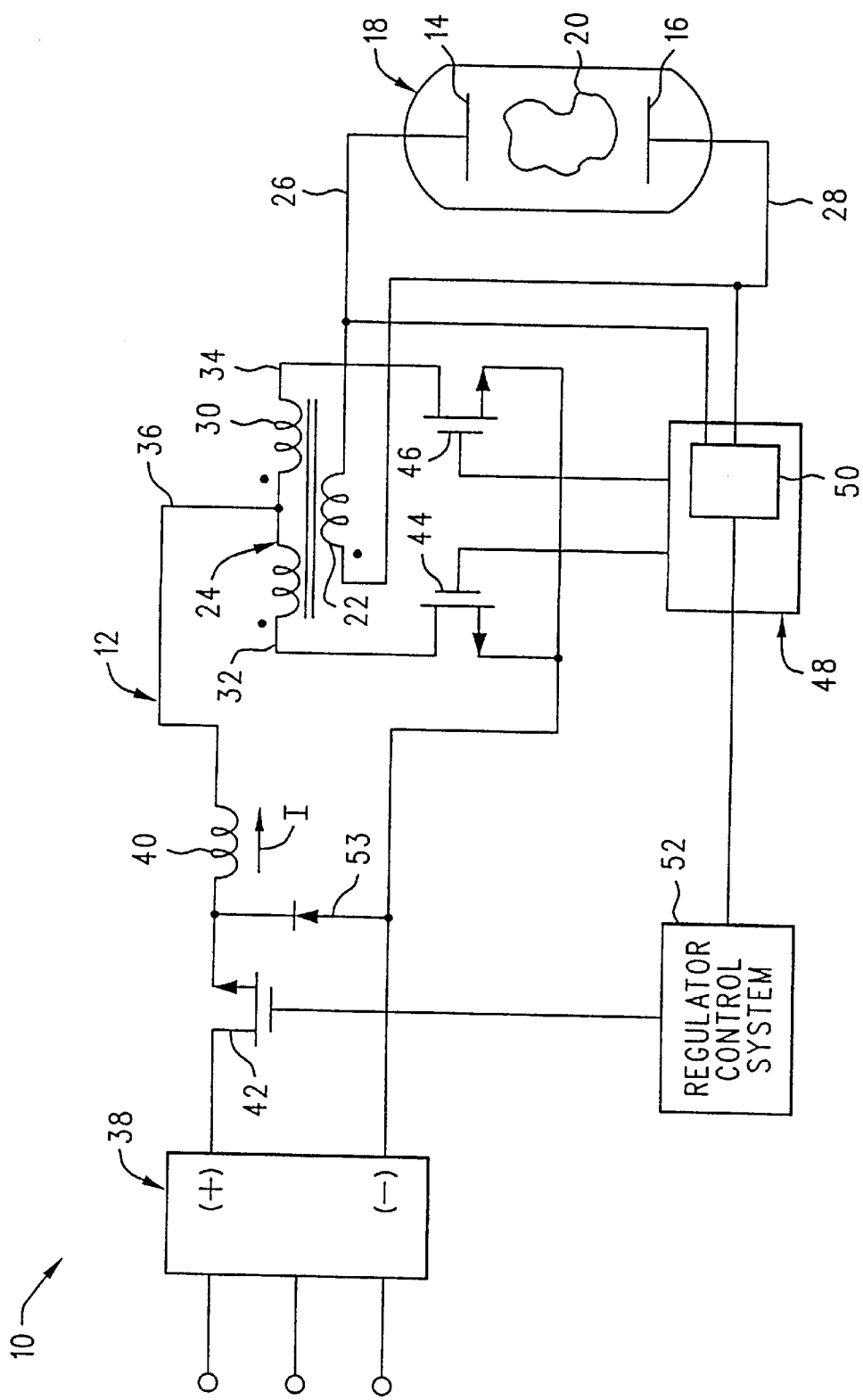
FIG. 1 is a schematic of one embodiment of an AC plasma processing system according to the present invention.

An AC plasma processing system 10 according to the present invention is shown in FIG. 1 and may comprise a power supply circuit 12 for providing an alternating current to first and second electrodes 14 and 16 contained within a process chamber, such as a vacuum chamber 18. In one preferred embodiment, the vacuum chamber 18 may also include various other devices such as vacuum pumps, pressure regulators, cooling systems, etc., (not shown) that may be required to introduce into the vacuum chamber 18 the process gas (e.g., argon) and to maintain the pressure of the process gas within predetermined limits.

An alternating electric field created between the first and second electrodes 14 and 16 by the power supply 12 ionizes the process gas (not shown) to produce a plasma 20 for accomplishing the desired process (e.g., deposition or etching, as the case may be). The first and second electrodes 14 and 16, respectively, are connected across a secondary winding 22 of a current transformer 24 by any suitable means, such as a pair of flexible wire conductors 26 and 28. In one preferred embodiment, the current transformer 24 is of the center tap design and includes a primary winding 30 having a first end lead 32, a second end lead 34, and a center tap lead 36. The center tap lead 36 of primary winding 30 is connected to a positive (+) terminal of a DC power supply 38 through a first inductor 40 and a current regulating switch 42. The first end lead 32 of primary winding 30 is connected to the negative (−) terminal of power supply 38 through a first switching device 44, whereas the second end lead 34 is connected to the negative (−) terminal through a second switching device 46. A freewheel diode 53 is connected between the inductor 40 and the negative (−) terminal of DC power supply 38.

A switching device control system 48 is connected to first and second switching devices 44 and 46. Briefly, the switching device control system 48 generates respective first and second switch control signals 54 and 56 (FIGS. 2A and 2B) which periodically trigger or actuate the first and second switching devices 44 and 46, switching them from non-conducting states to conducting states and vice-versa. The first and second switching devices 44 and 46 are actuated in an alternating manner to produce a corresponding alternating current on the secondary winding 22 of transformer 24. The alternating current in the secondary winding 22 develops an alternating voltage 58 (FIG. 2C) across the electrodes 14 and 16, as will be explained in greater detail below.

Figure 2A:
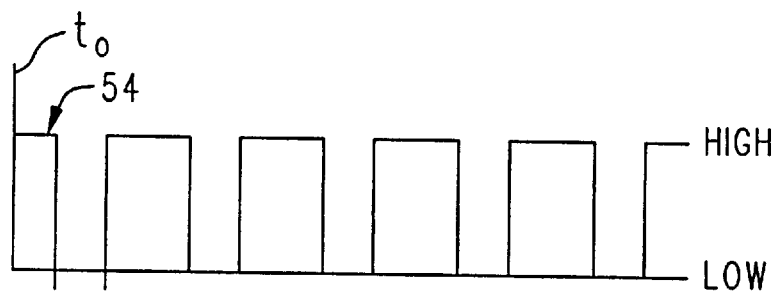
FIG. 2A is a graphical representation of the first switch control signal produced by the switching device control system.
Figure 2B:
FIG. 2B is a graphical representation of the second switch control signal produced by the switching device control system.
Figure 2C:
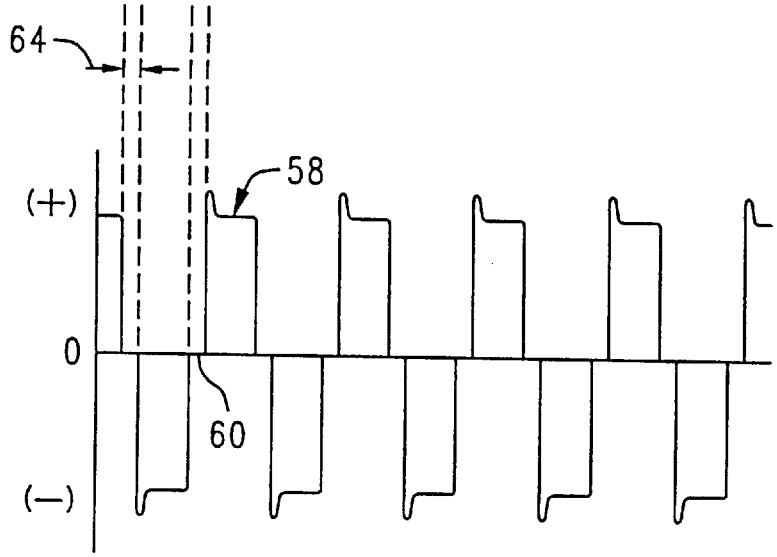
FIG. 2C is a graphical representation of the alternating voltage produced in the secondary winding of the transformer resulting from the alternating current flowing between the electrodes and in the plasma.

Another feature of the first and second switch control signals 54 and 56 is that they overlap slightly, i.e., an overlap time 64 exists between the two signals. During the overlap time 64, both switching devices 44 and 46 are closed, which short-circuits the primary winding 30 of transformer 24. The short-circuit in primary winding 30 induces a short-circuit in the secondary winding 22, the effect of which is to reduce substantially to zero the current flowing in the secondary circuit, i.e., the circuit comprising the secondary winding 22, the first and second electrodes 14 and 16, and the plasma 20. Consequently, the voltage developed across the two electrodes 14 and 16 will generally be significantly lower than the arcing voltage associated with the vacuum chamber 18. Indeed, in many applications the voltage across the electrodes 14, 16 during the overlap time 64 (i.e., during the dwell period 60) will be essentially zero, as shown in FIG. 2C. As used herein, the term "arcing voltage" is defined as that voltage between the electrodes 14 and 16 above which an arcing condition exists.

In one preferred embodiment, the switching device control system 48 may also include an arc detection circuit 50 connected to the first and second electrodes 14 and 16 for detecting the occurrence of an arc condition and for generating an arc condition signal. The arc condition signal may then be used to close both the first and second switching devices 44 and 46 to short-circuit the primary winding 30 whenever an arcing condition is detected. A regulator control system 52 connected to the switching device control system 48, the arc detection circuit 50, and to the current regulating switch 42 may be used to regulate the current I (shown in the direction of positive current flow) flowing into the primary winding 30 of transformer 24. Freewheel diode 53 provides a path for current to flow into inductor 40 when switch 42 is in the non-conductive state.

The AC plasma processing system 10 according to the present invention may be operated in one of two modes depending on the desired performance of the system. In the first mode, referred to herein as the "passive arc suppression mode," the circuit 10 is operated so that the first and second switches 44 and 46 are periodically and alternately opened and closed (i.e., switched from the non-conducting state to the conducting state and vice-versa) to produce an alternating current in the secondary winding 22 and, of course, the first and second electrodes 14 and 16. The alternating current on the electrodes 14, 16 allows the process within vacuum chamber 18 to operate in a conventional AC processing mode. The passive arc suppression function is achieved during the overlap time 64, that is, during the time the primary winding 30 is short-circuited. Passive arc suppression is achieved by virtue of the fact that the voltage potential between the electrodes 14, 16 during the time the primary winding 30 is short-circuited (i.e., during the dwell period 60, FIG. 2C) is lower than the arcing voltage of the vacuum chamber 18. However, in the event more robust arc suppression is desired or required, the processing system 10 may be provided with the optional arc detection circuit 50.

When provided with the arc detection circuit 50, the power supply 12 may be operated in an "active arc suppression mode" in which the primary winding 30 is short-circuited whenever an arc condition is detected. As mentioned above, the primary winding 30 may be short-circuited by closing both switching devices 44 and 46. In one preferred embodiment, the regulator control system 52 also opens the current regulating switch 42 during the time the primary winding 30 is short-circuited to prevent excessive current I from flowing through the primary winding 30.

The operation of the AC plasma processing system 10 in the passive arc suppression mode is best understood by referring to FIGS. 1 and 2A–2C. During a steady state operating condition (i.e., no arcing), the switching device control system 48 produces a first switch control signal 54 for operating the first switching device 44 and a second switch control signal 56 for operating the second switching device 46. See FIGS. 2A and 2B. The switch control signals 54 and 56 turn on (i.e., switch to the conducting state) the respective first and second switching devices 44 and 46 when in the "high" state, and turn them off (i.e., non-conducting) when in the "low" state.

The first and second switch control signals 54 and 56 generally alternate, resulting in a corresponding alternating actuation of the first and second switching devices 44 and 46. The alternating actuation of the switching devices 44 and 46 causes the current I to flow in the primary winding 30 in an alternating fashion between the center tap lead 36 and the first end lead 32 and the center tap lead 36 and the second end lead 34. Since each half of the primary winding 30 is wound in an opposite direction, the effect of switching the current through alternate halves of the primary winding 30 is to induce an alternating current in the secondary winding 22. The alternating current in the secondary winding 22 in turn causes an alternating voltage 58 to appear across the electrodes 14 and 16. See FIG. 2C.

As was described above, the first and second switch control signals 54 and 56 include an overlap time 64 during which both switch control signals are "high." As a result, both switching devices 44 and 46 are closed during the overlap time 64 and current will flow through both halves of the primary winding 30. Since each half of the primary winding 30 is wound in the opposite direction, the effect is identical to short-circuiting the primary winding 30. The short-circuited primary winding 30 induces a short-circuit in the secondary winding 22, the effect of which is to nearly instantaneously reduce to zero the current flowing in the secondary circuit, i.e., the circuit comprising the secondary winding 22, the first and second electrodes 14 and 16, and the plasma 20. Consequently, the voltage developed across the electrodes 14 and 16 during the dwell period 60, i.e., during the time that the primary winding 30 is short-circuited, will usually be less than the arcing voltage associated with the chamber 18. Indeed, for many applications, the voltage during the dwell period 60 will be substantially zero. The dwell period 60 tends to stabilize the plasma 20 and discourages the formation of arcs within the vacuum chamber 18.

If the AC plasma process 10 is provided with an arc detection circuit 50, then it may be operated in the "active arc suppression mode." The operation of the process in the active arc suppression mode is essentially identical to the operation in the passive arc suppression mode except that both the first and second switching devices 44 and 46 are closed (i.e., switched to the conductive state) to short-circuit the primary winding 30 whenever an arc condition is detected by the arc detection circuit 50. The regulator control system 52 is also connected to the arc detection circuit 50 and opens the current regulating switch 42 upon the detection of an arc event, thus preventing increased current I from flowing in the inductor 40, primary winding 30, and switching devices 44 and 46. Consequently, when operated in the active arc suppression mode, the AC plasma processing system 10 will be capable of quenching an arc that may unexpectedly develop during normal AC operation.

A significant advantage associated with the AC plasma processing system 10 according to the present invention is that it can produce an AC voltage potential across the electrodes 14 and 16 without the need to resort to complex or expensive electronic circuit elements. The periodic short-circuiting of the primary winding 30 during the overlap time 64 results in a characteristic dwell period 60 (FIG. 2C) in which the voltage potential between the electrodes 14 and 16 is less than the arcing voltage associated with the chamber 18. Therefore, the dwell period 60 stabilizes the plasma process and substantially reduces the chances that an arc will develop within the vacuum chamber 18.

Yet another advantage of the plasma processing system 10 is that it may be provided with an arc detection circuit 50 to short-circuit the primary winding 30 of transformer 24 whenever an arc condition is detected, e.g., during the normal AC processing mode. The short-circuited primary winding 30 produces a corresponding dwell period 60, which quenches the arc before it has a chance to fully develop.

Still other advantages are associated with the center tap design of the transformer 24. The dual primary windings provide a convenient means for producing an alternating current on the secondary winding 22 from a DC supply voltage with a minimum number of switching devices. The current regulating switch 42 and inductor 40 allow a relatively constant current I to be provided to the transformer 24 which in turn corresponds to a relatively constant current flow in the plasma 20. The constant current is advantageous in plasma processing systems. The regulator control system 52 switches the current regulating switch 42 to a non-conductive state in the event an arc condition is detected or in the event both switches 44 and 46 are simultaneously in the conductive state for some other reason, thus preventing any further increase of current in the primary winding 30 and switching devices 44 and 46. Freewheel diode 53 provides a path for current flow in inductor 40 when the current regulating switch 42 is open (i.e., in the non-conductive state). Therefore, when the current regulating switch 42 is closed, the current will remain near its original level to continue the plasma process.

Having briefly described the AC plasma processing system 10, as well as some of its more significant features and advantages, the processing system 10 according to the present invention will now be described in detail. Referring back now to FIG. 1, the improved plasma processing system 10 is shown as it may be used in conjunction with a conventional DC power supply 38, preferably of the three-phase rectified voltage type, although other types of power supplies, such as batteries or DC generator power supplies, could also be used. The first and second electrodes 14 and 16 are positioned within a vacuum chamber 18 and may be connected in any of a variety of ways well-known in the art depending on the particular plasma process to be performed. For example, if sputter deposition is to be performed within the chamber 18, a target (not shown) may be connected as one electrode (e.g., first electrode 14). The second electrode 16 may comprise a separate component or may comprise the vacuum chamber 18 itself. Of course, the vacuum chamber 18 may also include a variety of other components and devices necessary to accomplish the desired plasma process. For example, the vacuum chamber 18 will usually be connected to a supply of a suitable process gas (not shown), such as argon, as well as a suitable pumping apparatus (also not shown) to maintain the process gas contained within the chamber 18 at the desired pressure. If reactive sputtering is to be performed, then the vacuum chamber 18 will also be connected to a supply of the reactive species (not shown), such as oxygen. A valve assembly (not shown) will also usually be included to allow for the precise adjustment of the flow of the reaction gas into the chamber 18. The vacuum chamber 18 may also include various other systems, such as cooling systems, process monitoring systems, etc., all of which are well-known in the art and could be easily provided by persons having ordinary skill in the art. Consequently, the vacuum chamber 18 will not be described in further detail.

The power supply circuit 12 is used to provide an alternating current which develops a corresponding alternating voltage 58 (FIG. 2C) across the first and second electrodes 14 and 16. In one preferred embodiment, the power supply circuit 12 comprises a transformer 24 having a primary winding 30 and a secondary winding 22. The secondary winding 22 may be connected to the first and second electrodes 14 and 16 by any convenient type of electrical conductor, such as pair of wire cables 26 and 28, respectively.

The primary winding 30 of transformer 24 comprises a center-tapped primary winding having a first end lead 32, a second end lead 34 and a center tap lead 36. Each half of the primary winding 30, i.e., the halves defined between the center tap lead 36 and the first end lead 32 and the center tap lead 36 and the second end lead 34, is wound in the opposite direction, as indicated by the dots adjacent each half of the winding 30. The turns ratio between each half of the primary winding 30 and the secondary winding 22 is selected to produce the desired voltage on the secondary winding 22 with a given input voltage and current. Also, it is preferred, but not required, that each half of the primary winding 30 have the same number of turns. In one preferred embodiment, the transformer 24 may comprise a primary winding 30 in which each half has a turns ratio of 1:4 with respect to the secondary winding 22.

The center tap lead 36 of primary winding 30 is connected to the positive (+) terminal of a DC voltage source 38 via inductor 40 and current regulating switch 42. The first and second end tap leads 32 and 34 are connected to the negative (−) terminal of the DC voltage source 38 via first and second switching devices 44 and 46, respectively. A freewheel diode 53 is connected between the negative (−) terminal of the power supply 38 and the inductor 40 in the manner shown. While a number of various devices may be used for the electronic components described above, depending on the particular application and desired power output of the circuit 12, in one preferred embodiment, the inductor 40 comprises a 0.5 mH choke and the freewheel diode 53 comprises a high speed switching diode rated at 600 V, 60 A, such as a no. IXYS-DSE-12X61-06C, which is readily commercially available.

Similarly, the current regulating switch 42 and first and second switching devices 44 and 46 may comprise any number of devices capable of switching the expected currents and voltages at the rates commensurate with the desired frequency of the output voltage 58 (FIG. 2C). In one preferred embodiment, the current regulating switch 42 comprises an insulated gate bipolar transistor (IGBT) rated at 600V, 100A, such as a type 1MB1300L, which is available from Fuji, Inc. First and second switching devices 44 and 46 also comprise IGBTs, but rated at 1200V, 100A, such as type 1MB1200L-120, also available from Fuji, Inc.

The switching device control system 48 may comprise a simple oscillator circuit for producing respective first and second switch control signals 54 and 56 suitable for actuating the switching devices 44 and 46. In one preferred embodiment, the first and second switch control signals 54 and 56 comprise square wave signals having substantially identical frequencies, but offset in phase from one another so that first and second switching devices 44 and 46 are operated in an alternating fashion and with an overlap time 64. More specifically, the first switch control signal 54 (FIG. 2A) may be "high" at a time $t_0$, thus placing the first switching device 44 in the conducting (i.e., closed) state. Before the first switch control signal 54 goes low (i.e., switching switch device 44 to the non-conducting state), the control system 48 generates a second switch control signal 56 at the high state, thus placing the second switching device 46 in the conducting (i.e., closed) state. Both switching devices 44 and 46 are then in the conducting state during the overlap time 64. Next, before the second switch control signal 56 goes "low," the first signal 54 (FIG. 2A) again goes "high." This overlapping switch actuation sequence periodically short-circuits the primary winding 30 which results in a dwell period 60 on the alternating voltage signal 58 (FIG. 2C) produced across the electrodes 14 and 16 as will be explained in greater detail below.

Electronic circuits for producing square wave control signals, such as signals 54 and 56, are numerous and well-known in the art and could be easily provided by persons having ordinary skill in the art after having become familiar with the teachings of the present invention. Consequently, the switching device control system 48 will not be described in further detail.

Figure 3:
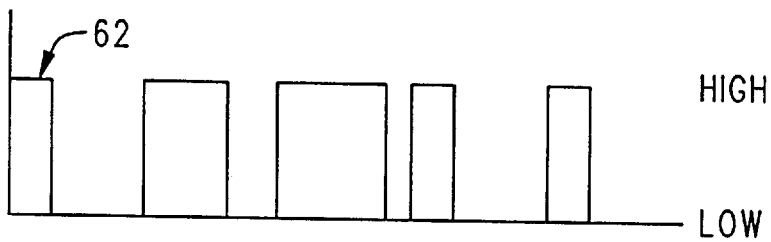
FIG. 3 is a graphical representation of a pulse width modulated signal produced by the regulator control system for activating the current regulating switch.

The regulator control system 52 basically comprises a circuit for producing a regulator control signal 62 for controlling the "on" time of the current regulating switch 42. When the regulator control signal 62 is "high" it switches the current regulating switch 42 to the conductive state, which, if either switch 44 or 46 is closed, results in a linear increase in the current I flowing through the inductor 40. Conversely, when the control signal 62 is "low," switch 42 is open, and the current I flowing through inductor 40 begins to decrease in a linear manner. In one preferred embodiment, the regulator control signal 62 produced by the regulator control system 52 comprises a pulse-width modulated (PWM) signal to control the "on" time of current regulating switch 42. See FIG. 3.

Since electronic circuits for producing pulse width modulated signals are well-known in the art and could be easily provided by persons having ordinary skill in the art after having become familiar with the teachings of the present invention, the regulator control system 52 will not be described in further detail.

As was mentioned above, the AC plasma processing system 10 can be operated in the "passive arc suppression mode" if it does not include the optional arc detection circuit 50. When operating in the passive arc suppression mode, the switching device control system 48 simply provides the offset but overlapping first and second switch control signals 54 and 56 (FIGS. 2A and 2B) to the respective switching devices 44 and 46 for a time and at a frequency that may be appropriate for the particular plasma process being used. Similarly, the regulator control system 52 provides the PWM regulator control signal 62 (FIG. 3) to the current regulating switch 42 so that the current I flowing through the primary circuit remains substantially constant and at the desired magnitude.

The operation of the circuit 10 in the passive arc suppression mode is best understood by referring to FIGS. 1 and 2A–2C simultaneously. The DC power supply 38 may provide a suitable DC voltage at the positive (+) and negative (−) terminals by rectifying a conventional three phase AC current. Of course, the magnitude of the DC voltage will depend on the plasma process voltage desired and, of course, on the turns ratio of the transformer 24. In one preferred embodiment, the DC power supply 38 provides a substantially constant output voltage at the positive (+) and negative (−) terminals of about 350 volts. When the current regulating switch 42 is closed, as well as one or both of the switching devices 44 and 46, current I will flow from the positive (+) terminal, through the inductor 40 and primary winding 30, through the closed switching device(s) (e.g., 44, 46, or both) and back to the negative (−) terminal. The combination of current regulating switch 42, regulator control system 52, and inductor 40 allows the current I to be controlled within a desired range to control the current flowing through the plasma 20 to accomplish the desired plasma process. These elements also protect the transformer 24 and the switches 44 and 46 in the event both switches 44 and 46 remain closed for a substantial amount of time, such as during the detection of an arc event, as will be described below.

The alternating voltage 58 (FIG. 2C) is developed across the first and second electrodes 14 and 16 by the alternating current induced in the secondary winding 22 by the alternating current flowing through the primary winding 30 resulting from the periodic actuation of the first and second switching devices 44 and 46. Referring now to FIGS. 2A–2C, the first and second switch control signals 54 and 56 actuate the respective switching devices 44 and 46 in an alternating manner. When the first signal 54 is "high" switching device 44 is in the conducting state (i.e., closed) and current I flows through the center tap lead 36, through the first half of primary winding 30, first end lead 32 and switch 44. The current I flowing through the first half of the primary winding 30 induces a corresponding positive current flow in the secondary winding 22. When the second switch control signal 56 goes "high" the second switching device switches to the conducting state. However, the first switch 44 is still conducting. During this overlap time 64, the magnetic field produced by the primary winding 30 remains constant and the output voltage drops substantially to zero since the two halves of the primary winding 30 are wound in opposite directions. Put in other words, the primary winding 30 is effectively short-circuited. As a result, the alternating current in the secondary winding 22 drops substantially to zero. Consequently, the voltage produced across the first and second electrodes 14 and 16 during the dwell period 60 (i.e., during the time the primary winding 30 is short-circuited) will be substantially below the arcing voltage associated with the chamber 18. Indeed, in many applications, the resulting voltage across the electrodes 14, 16 during the dwell period 60 will be nearly zero.

At the end of the overlap time 64, the first switch control signal 54 goes "low" turning off switch 44 and removing the short-circuit from the primary winding 30. At this time, all of the current in the primary circuit flows through the second half of primary winding 30 (i.e., from center tap lead 36 to the second end lead 34), reversing the change in the magnetic field in the transformer 24 and creating a negative current flow and hence a negative voltage swing across the electrodes 14 and 16. See FIG. 2C. Consequently, the current and voltage across the electrodes 14 and 16 remains substantially constant until the first switch control signal 54 again goes "high" (FIG. 2A). When that happens, the primary winding 30 is again effectively short-circuited, causing the current and hence voltage developed in the secondary winding 22 to rapidly change toward zero. The current and voltage in the secondary winding 22 remains substantially zero during the dwell period 60, that is, all the while the primary winding 30 is short-circuited. The process then repeats, first sending current through one half of the primary winding 30, then both halves (i.e., the short-circuiting the primary) then the other half, the effect of which is to produce an alternating current in the secondary circuit which, in turn, produces a corresponding alternating voltage 58 across the electrodes 14 and 16 having a characteristic dwell period 60 substantially in the form shown in FIG. 2C.

The dwell period 60 has a stabilizing effect on the plasma process occurring within the vacuum chamber 18 because the voltage developed across the electrodes 14 and 16 is generally significantly lower than the arcing voltage associated with the vacuum chamber 18, thereby reducing the tendency for arcs to develop within the chamber 18. While the RMS voltage, peak-to-peak voltage, and frequency of the AC voltage 58 placed on the electrodes 14 and 16 will depend on the applied current and the particular plasma process to be performed, as well as on the materials being used, one embodiment of the AC plasma processing system utilizes an AC current having an RMS current of about 20 amperes, a peak-to-peak current of about 42 amperes, and a frequency of about 30 kHz. Similarly, the duration of the dwell period 60 may also be varied to optimize a particular plasma process. In one preferred embodiment, the duration of the dwell period 60 is about 2 $\mu$s, although longer or shorter times could also be used. Of course, other values can be used and the present invention should not be regarded as limited to any particular AC current or voltage characteristics specified herein.

Figure 4:
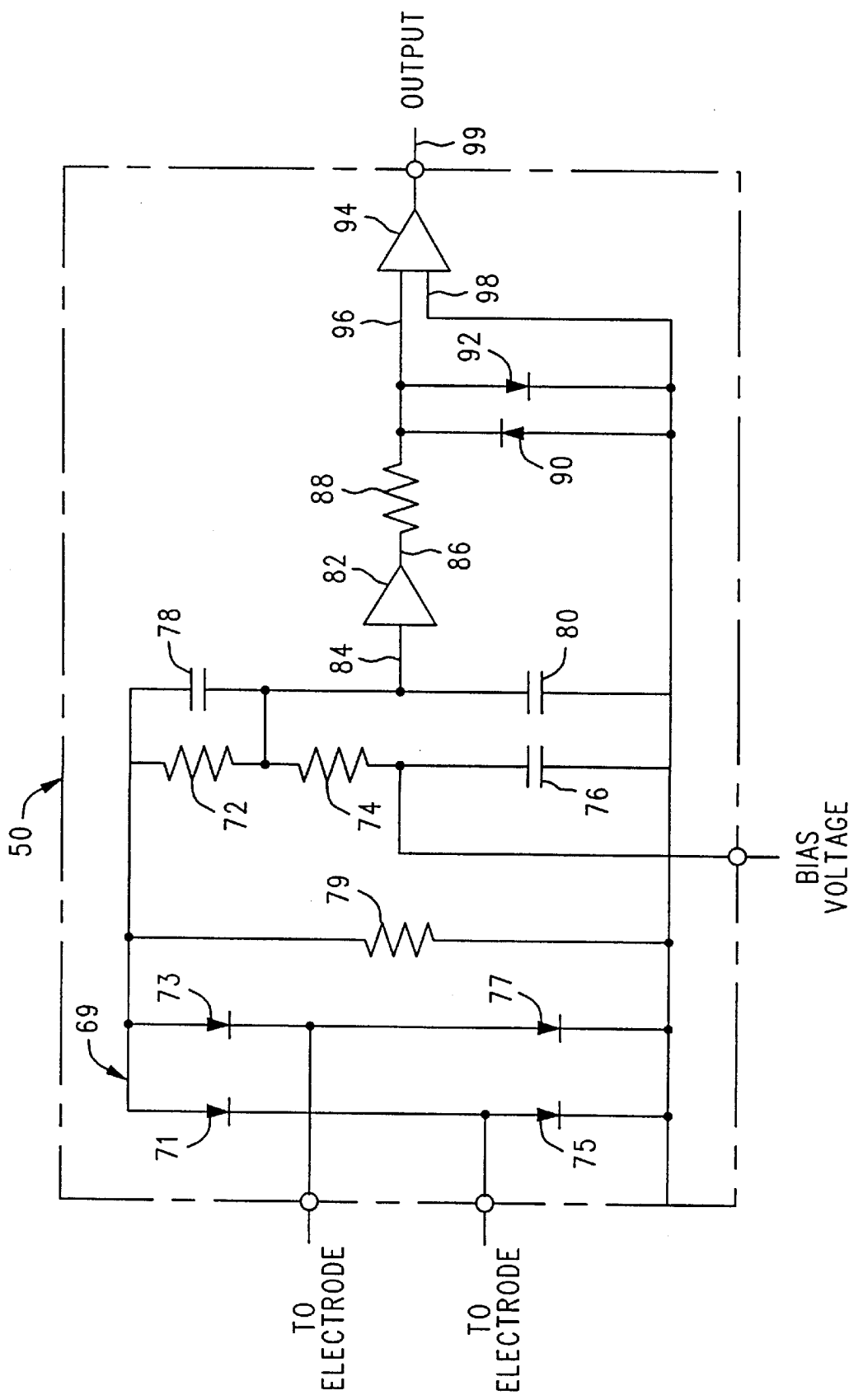
FIG. 4 is a schematic of one embodiment of an arc detection circuit that could be used with the present invention.

As was described above, the AC plasma processing system 10 according to the present invention may also be provided with an arc detection circuit 50. The arc detection circuit 50 works in concert with the normal operation of the switching device control system 48 to close both switching devices 44 and 46, i.e., short-circuit the primary winding 30 whenever an arc condition is detected. While many different kinds of arc detection devices are known and may be used with the present invention, one preferred embodiment of the present invention uses an arc detection circuit 50 substantially as shown in FIG. 4.

Essentially, arc detection circuit 50 may comprise first and second resistors 72 and 74 connected in series with a first capacitor 76 across a rectifying diode bridge circuit 69. Rectifying diode bridge circuit 69 may comprise a plurality of diodes 71, 73, 75, and 77 arranged in the conventional manner to provide full wave rectification of the alternating current between the first and second electrodes 14 and 16. An optional resistor 79 also may be connected across the diode bridge circuit 69 in the manner shown. A second capacitor 78 is connected in parallel with the first resistor 72. A third capacitor 80 is connected in series with the second capacitor 78 so that it is also connected in parallel with the series arrangement of resistor 74 and capacitor 76. The combination of resistors 72, 74 and capacitors 78 and 80 form a compensated voltage divider network which provides to the buffer amplifier 82 a reduced-voltage signal 84 that more accurately represents the actual voltage signal (i.e., wave-form) on the first and second electrodes 14 and 16 than is possible with conventional, purely resistive voltage divider networks. A bias voltage applied to resistor 74 defines the voltage level at which an arc condition is to be recognized. That is, an arc condition exists and is recognized by the arc detection circuit 50 if the voltage potential between the electrodes starts to decrease rapidly during the positive part of the cycle or starts to increase rapidly during the negative part of the cycle, in either case passing through a defined voltage level. The defined voltage level can be varied by adjusting the magnitude of the positive bias voltage applied to resistor 74.

The reduced voltage signal 84 from the compensated voltage divider network is then fed into buffer amplifier 82. The output signal 86 from buffer amplifier 82 is fed via resistor 88 to a diode clamp circuit comprising diodes 90 and 92. Under normal circumstances, the output signal 86 from buffer amplifier 82 will be negative. Hence, current will flow via resistor 88 and diode 90 and a negative clamped voltage of about 0.6 volts will appear across the input leads 96, 98 of comparator 94. Conversely, if the output signal 86 from amplifier 82 goes positive, diode 92 will conduct, again imposing a clamped voltage of about 0.6 volts across input leads 96 and 98 of comparator 94. The arrangement of diodes 90 and 92, along with resistor 88 forms a non-linear voltage divider network which substantially reduces the input impedance presented to the input of comparator 94, thus removing a substantial amount of the RF (i.e., radio frequency) noise present in the output signal 86. The comparator 94 produces an output signal 99 when the voltage across its input leads 96, 98 passes through zero. The output signal 99 from comparator 94 may then be fed into the switching device control system 48 which will in turn on switches 44 and 46 so that they are in the conductive state. The output signal 99 may also be fed into the regulator control system 52, which will turn off current regulating switch 42. It should be noted that in this application it will be desirable to design the switching device control system 48 so that it will ignore the signal 99 from the arc detection circuit 50 if the signal is received during the normal dwell period 60 (FIG. 2C).

As was described above, the provision of an arc detection circuit, such as circuit 50, will allow the circuit 12 to be operated in either the passive arc suppression mode described above or in an active arc suppression mode. The operation of the circuit 12 in the active arc suppression mode is essentially the same as the operation of the circuit in the passive mode, except that the switching device control system 48 will turn on both switches 44 and 46 (i.e., short-circuit the primary winding 30) upon the detection of an arc condition by circuit 50. In addition, the regulator control circuit 52 will turn off regulator control switch 42 to prevent the current I from increasing during this period.

This completes the detailed description of the preferred embodiments of the AC plasma processing system 10 according to the present invention. While a number of specific components were described above for the preferred embodiments of this invention, persons skilled in this art will readily recognize that other substitute components or combinations of components may be available now or in the future to accomplish comparable functions to the apparatus described herein. For example, persons having ordinary skill in the art will recognize that the polarity of the power supply 38 could be reversed by changing the positions of the various electronic components to be consistent with the reversed polarity. Of course, any number of different voltages, currents, frequencies, etc., could be used depending on the requirements of the particular plasma process.

Still other modifications are possible, for example the center-tapped transformer 24 could be replaced with a conventional transformer that does not have a center tapped primary winding. The required alternating current can be produced in the secondary winding of the transformer by using a conventional bridge-type switching circuit comprising four switching devices to alternately direct current through the primary winding in opposite directions. That is, current could be made to flow in one direction by opening a pair of switches between the primary winding and the power supply while the other pair are closed. The current could then be made to flow in the other direction by reversing the states of the switches. The primary winding can be short circuited to produce an AC signal 58 having the characteristic dwell period 60 by actuating the switches according to the appropriate switching schedule, as would be obvious to persons having ordinary skill in the art after having become familiar with the details of this invention.

Consequently, it is contemplated that the inventive concepts herein described may be variously otherwise embodied and it is intended that the appended claims be construed to include alternative embodiments of the invention except insofar as limited by the prior art.

What is claimed is:

1. A circuit for placing an alternating current on a first electrode and a second electrode positioned within a process chamber, the process chamber having associated with it an arcing voltage above which an arc condition exists, comprising:

a transformer having a primary winding and a secondary winding, the primary winding having a first end lead and a second end lead both of which are connected to an external power supply, the secondary winding being connected across the first and second electrodes;

switching means connected to the first and second end leads of the primary winding for periodically short circuiting the primary winding, wherein the short circuited primary winding induces a secondary voltage in the secondary winding that is less than the arcing voltage.

2. The circuit of claim 1, wherein said transformer includes a center tap lead connected to a first terminal of the external power supply, the center tap lead being connected to the primary winding such that the primary winding is divided into a first half and a second half, the primary winding being wound such that the first half and the second half have opposite polarities, and wherein said switching means includes a first switching device connected between the first end lead of the primary winding and a second terminal of the external power supply, said first switching device being switchable between a conductive state and a non-conductive state to electrically connect and disconnect the first end lead of the primary winding and the second terminal of the external power supply and a second switching device connected between the second end lead of the primary winding and the second terminal of the external power supply, said second switching device being switchable between a conductive state to a non-conductive state to electrically connect and disconnect the second end lead of the primary winding and the second terminal of the external power supply.

3. The circuit of claim 2, wherein said switching means includes a switching device control system connected to said first and second switching devices, said switching device control system being operable to actuate said first and second switching devices independently of the other to place the alternating current on the first and second electrodes and to periodically short circuit the primary winding of said transformer.

4. A circuit for placing an alternating voltage potential across a first electrode and a second electrode, positioned within a plasma processing chamber comprising:

a transformer having a primary winding and a secondary winding, the primary winding having a first end lead, a center tap lead, and a second end lead, the center tap lead being connected to a first terminal of an external power supply, the secondary winding being connected across the first and second electrodes;

a first switching device connected between the first end lead of the primary winding and a second terminal of the external power supply, said first switching device being switchable from a conductive state to a non-conductive state to electrically connect and disconnect the first end lead of the primary winding and the second terminal of the external power supply;

a second switching device connected between the second end lead of the primary winding and the second terminal of the external power supply, said second switching device being switchable from a conductive state to a non-conductive state to electrically connect and disconnect the second end lead of the primary winding and the second terminal of the external power supply;

a switching device control system connected to said first and second switching devices, said switching device control system being operable to actuate said first and second switching devices independently of the other to place the alternating voltage potential across the first and second electrodes.

5. The circuit of claim 4, further comprising a first inductor connected between the first terminal of the external power supply and the center tap lead of said transformer.

6. The circuit of claim 5, further comprising a current regulating switch connected between said first inductor and the first terminal of the external power supply, said current regulating switch being switchable from a conductive state to a non-conductive state to electrically connect and disconnect said first inductor and the first terminal of the external power supply.

7. The circuit of claim 6, further comprising a regulator control system connected to said current regulating switch, said regulator control system being operable to switch said current regulating switch between the non-conductive state and the conductive state.

8. The circuit of claim 7, further comprising a diode connected between the second terminal of the external power supply and said first inductor at a point between said first inductor and said current regulating switch.

9. The circuit of claim 8, wherein said switching device control system includes an arc detector connected to said second electrode for detecting an arc condition and for generating an arc condition signal when the arc condition is sensed.

10. The circuit of claim 9, wherein said arc detector comprises a non-linear voltage divider circuit for sensing the voltage across the first and second electrodes and for producing a low-noise output signal related thereto.

11. The circuit of claim 9, wherein said switching device control system is responsive to the arc condition signal produced by said arc detector, wherein said switching device control system switches said first and second switching devices to the conductive state upon detection of the arc condition signal.

12. The circuit of claim 11, wherein said regulator control system is connected to said arc detector and is responsive to the arc condition signal produced by the arc detector, wherein said regulator control system switches said current regulating switch to the non-conductive state upon detection of the arc condition signal.

13. The circuit of claim 12, wherein said regulator control system produces a pulse width modulated signal to control the current regulating switch.

14. A plasma processing system, comprising:

a vacuum chamber having a first electrode and a second electrode, said vacuum chamber being adapted to receive a process gas and maintain said process gas within a predetermined pressure;

a transformer having a primary winding and a secondary winding, the primary winding having a first end lead, a center tap lead, and a second end lead, the center tap lead being connected to a first terminal of an external power supply, the secondary winding being connected across the first and second electrodes;

a first switching device connected between the first end lead of the primary winding and a second terminal of the external power supply, said first switching device being switchable from a conductive state to a non-conductive state to electrically connect and disconnect the first end lead of the primary winding and the second terminal of the external power supply;

a second switching device connected between the second end lead of the primary winding and the second terminal of the external power supply, said second switching device being switchable from a conductive state to a non-conductive state to electrically connect and disconnect the second end lead of the primary winding and the second terminal of the external power supply;

a switching device control system connected to said first and second switching devices, said switching device control system being operable to actuate said first and second switching devices independently of the other to place the alternating voltage potential across the first and second electrodes.

15. The plasma processing system of claim 14, further comprising a first inductor connected between the first terminal of the external power supply and the center tap lead of said transformer.

16. The plasma processing system of claim 15, further comprising a current regulating switch connected between said first inductor and the first terminal of the external power supply, said current regulating switch being switchable from a conductive state to a non-conductive state to electrically connect and disconnect said first inductor and the first terminal of the external power supply.

17. The plasma processing system of claim 16, further comprising a regulator control system connected to said current regulating switch, said regulator control system being operable to switch said current regulating switch between the non-conductive state and the conductive state.

18. The plasma processing system of claim 17, wherein said switching device control system includes an arc detector connected to said second electrode for detecting an arc condition and for generating an arc condition signal when the arc condition is sensed.

19. The plasma processing system of claim 18, wherein said switching device control system is responsive to the arc condition signal produced by said arc detector, wherein said switching device control system switches said first and second switching devices to the conductive state upon detection of the arc condition signal.

20. The plasma processing system of claim 19, wherein said regulator control system is connected to said arc detector and is responsive to the arc condition signal produced by the arc detector, wherein said regulator control system switches said current regulating switch to the non-conductive state upon detection of the arc condition signal.

* * * * *